United States Patent [19]

Davey et al.

[11] Patent Number: 4,927,782
[45] Date of Patent: May 22, 1990

[54] METHOD OF MAKING SELF-ALIGNED GAAS/ALGAAS FET'S

[75] Inventors: John E. Davey, Alexandria; Aristos Christou, Springfield, both of Va.

[73] Assignee: The United States of America as represented by the Secretary of the Navy, Washington, D.C.

[21] Appl. No.: 371,778

[22] Filed: Jun. 27, 1989

[51] Int. Cl.$^5$ .......................................... H01L 21/338
[52] U.S. Cl. ...................................... 437/184; 437/38; 437/41; 437/126; 437/203; 437/228; 357/15
[58] Field of Search .................. 437/38, 40, 41, 90, 437/105, 126, 184, 228, 203, 15; 357/1 G, 232; 156/654

[56] References Cited

U.S. PATENT DOCUMENTS

| | | | |
|---|---|---|---|
| 3,761,785 | 9/1973 | Pruniaux | 317/235 |
| 3,898,353 | 8/1975 | Napoli et al. | 437/203 |
| 4,048,712 | 9/1977 | Buiatti | 29/580 |
| 4,194,285 | 3/1980 | Goel | 29/579 |
| 4,317,125 | 2/1982 | Hughes et al. | 357/15 |
| 4,325,073 | 4/1982 | Hughes et al. | 357/22 |
| 4,330,343 | 5/1982 | Christou et al. | 148/1.5 |
| 4,525,919 | 7/1985 | Fabian | 437/184 |
| 4,639,275 | 1/1987 | Holonyak, Jr. | 437/126 |
| 4,788,159 | 11/1988 | Smith | 437/90 |

FOREIGN PATENT DOCUMENTS

| | | | |
|---|---|---|---|
| 0188879 | 11/1982 | Japan | 437/184 |
| 0188884 | 11/1982 | Japan | 437/184 |

Primary Examiner—Brian E. Hearn
Assistant Examiner—T. Thomas
Attorney, Agent, or Firm—Thomas E. McDonnell; A. David Spevack

[57] ABSTRACT

A method of making a self-aligned FET includes the following steps. First, a selectively doped heterostructure substrate having a predetermined crystalline structure is obtained having a heavily doped top GaAs layer, having a heavily doped AlGaAs layer under the top layer that is resistant to orientation-dependent etching, and having an undoped underlying AlGaAs layer and an undoped bottom GaAs layer. Then, an uppermost GaAs layer is deposited on the top layer. Then, an angular recess is etched through the uppermost GaAs layer and through the top heavily doped GaAs layer of the heterostructure substrate with an orientation-dependent etchant down to the etch resistant AlGaAs layer, whereby the length of the angular recess is wider at the base of the recess than at the top of the recess because of the predetermined crystalline structure and the orientation-dependent etchant. Next, a refractory metal gate of tantalum silicide is deposited in the recess. The length of the refractory metal gate is substantially the same as the length of the top of the recess and is aligned therewith. The refractory metal gate is then covered with an etch resistant polyimide material. By subsequent steps including etching, source and drain implantation, and deposition of metal contacts, the fabrication of the self-aligned FET is completed.

12 Claims, 3 Drawing Sheets

METHOD OF MAKING SELF-ALIGNED GAAS/ALGAAS FET'S

BACKGROUND OF THE INVENTION

The present invention described herein relates to GaAs semiconductor devices and, more particularly, to field effect transistors (FET's) whose gates are self-aligned to the source and the drain.

In the prior art, a GaAs FET is made by a process which starts out by etching of mesa islands down to an undoped GaAs layer adjacent to a semi-insulating substrate to localize the active region. The source and drain ohmic contacts are defined and formed with a gold-germanium eutectic alloy and gold overlay. The rectifying contact for the gate is provided by the deposition of aluminum or a refractory on the surface of the undoped GaAs of the top epilayer. The disadvantages of this method are: (1) the gate may not be properly aligned with the source and drain; (2) source-drain sintering must be accomplished prior to gate definition; and (3) each gate must be individually defined.

Presently, selectively doped GaAs/AlGaAs heterojunction structures are being utilized for high performance digital applications. This so because the selectively doped GaAs/AlGaAs devices provide high electron mobility transistors that exhibit high speed microwave capabilities. However, at present, such selectively doped GaAs/AlGaAs devices are not self-aligned. Yet, in VLSI level circuits, in order to achieve high density, the gate of the FET must be self-aligned to the source and drain. It would be desirable, therefore, to provide a selectively doped GaAs/AlGaAs heterojunction device that has self-aligned gates.

In the prior art, the etching technique known as orientation-dependent etching is known. However, this techniques has not been successfully employed in the making of self-aligned gate GaAs FET's. It would be desirable to be able to employ orientation-dependent etching in making GaAs FET.

In the prior art, FET's having submicron length gates are known. However, fabrication of such devices requires complex photolithographic, optical microscopy based processes. It would be desirable to provide FET's having gates of submicron length without the need for the complex photolithographic based systems.

SUMMARY OF THE INVENTION

Accordingly, it is an object of the present invention to provide a method of making a GaAs field effect transistor in which the gate is self-aligned to the source and to the drain.

Another object of the invention is to provide a method of GaAs field effect transistor manufacture by which the field effect transistors can have gate lengths of submicron length.

Still another object of the invention is to provide a method of making GaAs field effect transistors in which orientation-dependent etching is employed.

Yet another object of the invention is to provide a selectively doped GaAs/AlGaAs heterojunction device that has self-aligned gates.

Briefly, these and other objects are accomplished by the following steps of fabricating a self-aligned field effect transistor (FET) by: obtaining a selectively doped heterostructure substrate having a predetermined crystalline structure and having a doped layer capable of being etched by an orientation etchant, having a layer under the doped layer that is resistant to the orientation etchant, and having an underlying undoped layer; etching a recess on the structure with an orientation etchant down to the etchant-resistant layer; depositing a metal gate in the recess; and implanting the source and drain regions with implantable ions into the layer that prevents etching by the orientation etchant.

More specifically, in accordance with the invention, the method includes the more specific steps of: obtaining a selectively doped heterostructure substrate having a doped GaAs layer capable of being etched by an orientation etchant, having an AlGaAs layer under the doped GaAs layer that is resistant to the orientation etchant, and having an underlying undoped GaAs layer; etching a recess on the structure with an orientation etchant down to the etchant resistant AlGaAs layer; depositing a metal gate in the recess with $TaSi_2$; and implanting the source and drain regions with implantable Si ions into the AlGaAs layer.

Other objects, advantages and novel features of the invention will become apparent from the following detailed description of the invention when considered in conjunction with the accompanying drawings herein.

DESCRIPTION OF THE PREFERRED EMBODIMENT(S)

Figure 1:
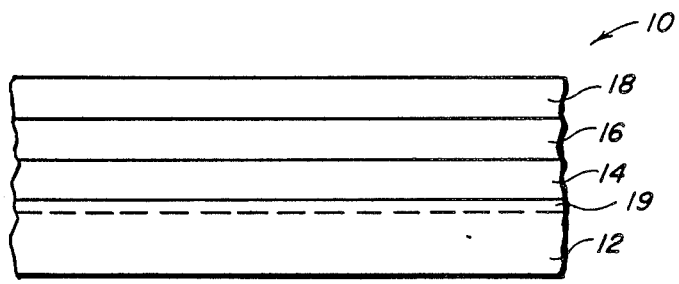
FIG. 1 shows a prior art selectively doped heterostructure substrate that is used as a starting point in the method of the invention.

With reference to FIG. 1, a prior art heterostructure substrate 10 is shown. The heterostructure substrate 10 may be obtained by deposition of the respective layers in a molecular beam epitaxy system which is used for the deposition of epitaxial layers. Such heterostructure substrates are used in the fabrication of modulation doped FET's (MODFET's).

More specifically, the heterostructure substrate 10 is comprised of a bottommost first layer 12 of undoped GaAs, a second layer 14 of undoped AlGaAs, a third layer 16 of highly n-doped AlGaAs, and a fourth layer 18 of highly n-doped GaAs. The highly n-doped third and fourth layers are doped in excess of $10^{18}$ n-dopant atoms per cubic centimeter. The second layer 14 is approximately 100 angstroms thick. The third layer 16 is approximately 500 angstroms thick. The fourth layer 18 is approximately 500 angstroms thick. A very thin two dimensional electron gas layer 19 is located between undoped GaAs layer 12 and undoped AlGaAs layer 14.

With respect to the crystalline structure of the layers in the heterostructure substrate 10, at least the layers 14, 16, and 18 are all oriented along the same direction with reference to an X-Y-Z frame of reference. More specifically, as is well known in the art, the layers of the heterostructure substrate 10 are oriented in a (1,0,0) orientation. The (1,0,0) orientation is obtained by proper adjustment of the molecular beam epitaxy apparatus.

Figure 2:
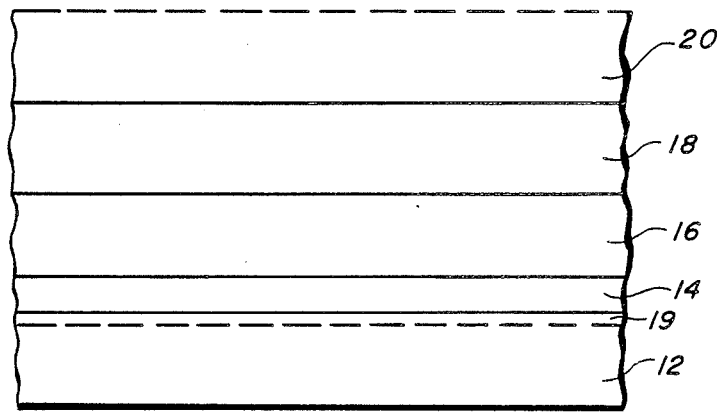
FIG. 2 shows the result of a step in the method of the invention wherein a GaAs layer has been added to the heterosubstrate of FIG. 1.

Now with respect to the invention, taking the prior art substrate 10 of FIG. 1, a fifth layer 20 is deposited on the substrate 10 to form the product shown in FIG. 2. The fifth layer 20 is comprised of GaAs approximately 10 angstroms thick. The fifth layer 20 is deposited by employing the molecular beam epitaxy system in a predetermined crystalline structure (1,0,0) direction. The thickness of the GaAs layer 20 could be in a range of 10-50 angstroms.

Alternatively, the fifth layer 20 could include a ternary compound, such as GaAlAs or InGaAs. Similarly, the thickness of the ternary compound could be in a range of 10-50 angstroms.

Figure 3:
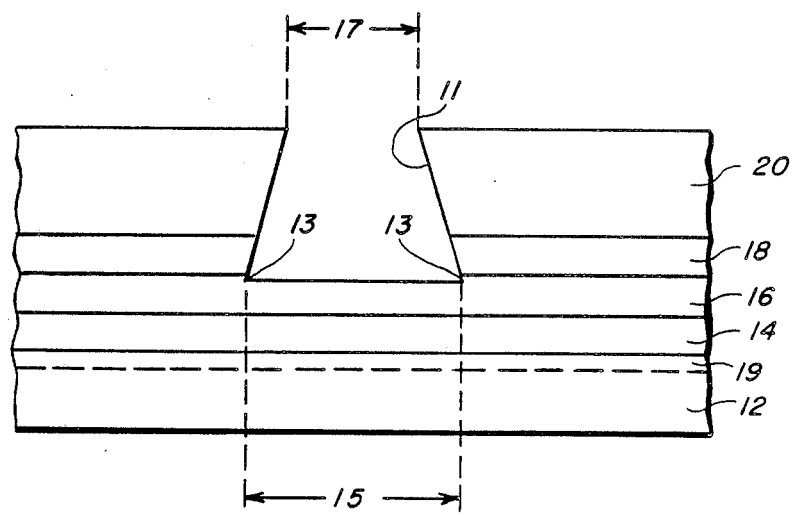
FIG. 3 shows the result of conducting orientation-dependent etching upon the product in FIG. 2.

Referring to FIG. 3, a liquid, orientation-dependent etchant is contacted with the product of FIG. 2 to obtain the product shown in FIG. 3. More specifically, the orientation-dependent etchant liquid will only etch in a certain direction along a certain type of crystal plane in a certain type of crystal. More specifically, the orientation-dependent etchant will etch along the predetermined crystalline structure (1,1,0) direction. The orientation-dependent etchant will etch only along the (1,1,0) direction and not along any other direction. The orientation-dependent etchant will effectively etch through the GaAs layer 20 and the highly n-doped GaAs layer 18, but it will not effectively etch the highly n-doped AlGaAs layer 16 due to the fact that the highly n-doped AlGaAs layer 16 is substantially etch-resistant due to its chemical and crystalline composition. More specifically, layer 16 will only be minimally etched by the orientation-dependent etchant. in this respect, the orientation-dependent etch provides a recess 11 having very sharp angled corners 13 (having a 60 degree angle) as a result of the etching process. The length 15 at the base of the recess 11 is depicted in FIG. 3. The length 15 at the base of the recess 11 is wider than at the top of the recess 11 which is length 17.

The orientation-dependent etchant liquid is comprised of a solution containing sulfuric acid:hydrogen peroxide:water in a ratio of approximately 1:8:1. An etchant with a ratio of 1:8:1 provides orientation-dependent etching at a rate of 150 angstroms per minute, defining an (1,1,0) section in GaAs.

Alternatively, orientation-dependent etchant liquids may be comprised of a hydrochloric acid:hydrogen peroxide:water solution in a ratio of approximately 1:1:9. The hydrogen chloride based etchant yields a well defined 60 degree angle for the (1,1,0), (1,1,0) planes. The etch rate is approximately 10 angstroms per hour for the etchant with hydrochloric acid.

The solutions of the orientation-dependent etchant will etch only a family of (1,1,0) planes. The orientation-dependent etchants will not attack or etch another family of planes.

The product depicted in FIG. 3 is the result of the orientation-dependent etch, whereby GaAs layer 20 and the highly n-doped GaAs layer 18 have been completely etched through, and whereby only a small surface portion of the highly n-doped AlGaAs, substantially etch-resistant layer 16 is etched.

The exact length of time for conducting the etch is determined by conducting an etch on a test piece by trial and measurement.

Once the etching step is completed, the product depicted in FIG. 3, having the recess 11 with the 60 degree angled corners 13, is washed and dried to be made ready for the next step in the process.

Figure 4:
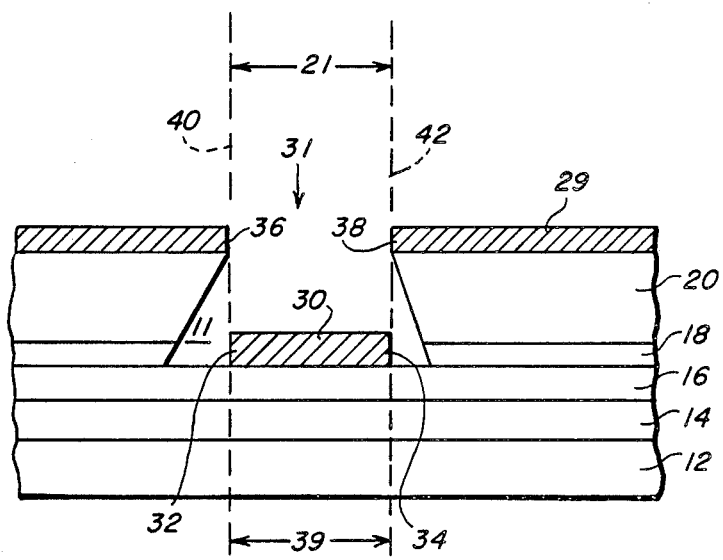
FIG. 4 shows the result of depositing gate metallization to the product in FIG. 3.

Next, a layer 29 of refractory metal silicide, namely tantalum silicide, is deposited on the product in FIG. 3 to provide the product depicted in FIG. 4. The thickness of the refractory metal silicide layer 29 is in the range of from 2,000 to 4,000 angstroms. The refractory metal compound is deposited by electron beam vapor deposition apparatus using conventional deposition procedures. Other refractory metal silicides that may be used include tungsten silicide and platinum silicide.

The product in FIG. 4 has a gate 30 located at the bottom of the recess 11. The gate 30 is composed of the silicide (tantalum silicide) that was deposited in the previous step. The edges 32 and 34 of the gate 30 are aligned with the top edges 36 and 38 of the gate opening 31 in the layer 20 GaAs. Dashed lines 40 and 42 illustrate the alignment of the respective edges 32 and 36 and 34 and 38. This alignment forms the basis of the alignment of the self-aligned FET that is produced by following the additional steps explained hereinbelow. The length 19 of the gate 30 is less than the length 15 of the base of the recess 11 and is equal to the length 21 of the gate opening 31 in FIG. 4. More generally, the length 19 of the gate 30 is defined as the linear dimension of the gate 30 that is present along the length 15 of the base of the recess 11.

Next, the recess 11 of the product of FIG. 4 is filled with an etch-resistant and organic-solvent-soluble material 15, such as a polyimide or other suitable high temperature dielectric organic resin, whereby the gate 30 is protected from further etching. The polyimide 15 is filled up past the surface of the layer 20 of GaAs and fills in next to the sides 44 and 46 of the top layer of 29 of tantalum silicide. The top surface 48 of the polyimide (or other suitable polymer) filling is in substantially the same plane as the top surface 50 of the silicide layer 29. The polyimide filled product is depicted in FIG. 5.

Figure 5:
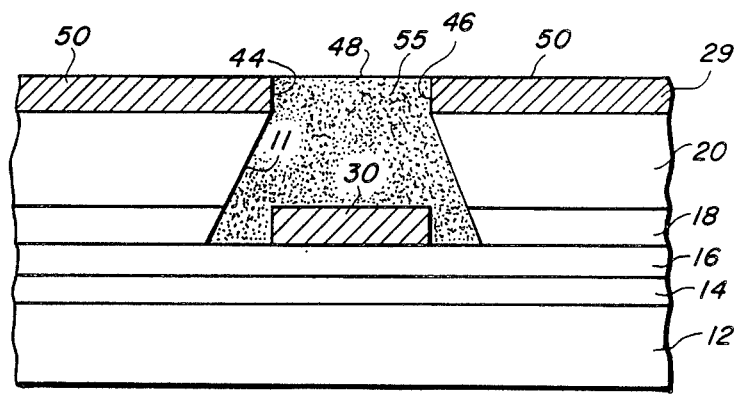
FIG. 5 shows the result of protecting the gate and planarizing the recess of the product in FIG. 4 with a polyimide.

The product in FIG. 5 is subjected to a hydrogen fluoride etching step in a conventional way, whereby the silicide layer 29 is removed leaving the polyimide material 15 in place in the recess 11.

Then the product is subjected to conventional plasma etching to etch the layer 20 of GaAs to a thickness of approximately 2,000 angstroms.

Then the product is placed in an ion implanter (not shown) wherein the source 52 and drain 54 are implanted in a conventional way with silicon ions. Then the product is annealed at 500-650 deg. C. to activate the silicon implant.

Then, the remainder of the top layer 20 of GaAs and the polyimide filling 15 are removed. More specifically, the polyimide is removed by an organic solvent such as acetone, and the remainder of the top GaAs layer 20 is removed by a non-orientation dependent etchant comprised of 7:1:1 of sulfuric acid:hydrogen peroxide:water. It is emphasized that a non-orientation dependent etchant should be used at this point in the process, not an orientation-dependent etchant that was used earlier in the process. The product obtained at this point is the product depicted in FIG. 6.

Figure 6:
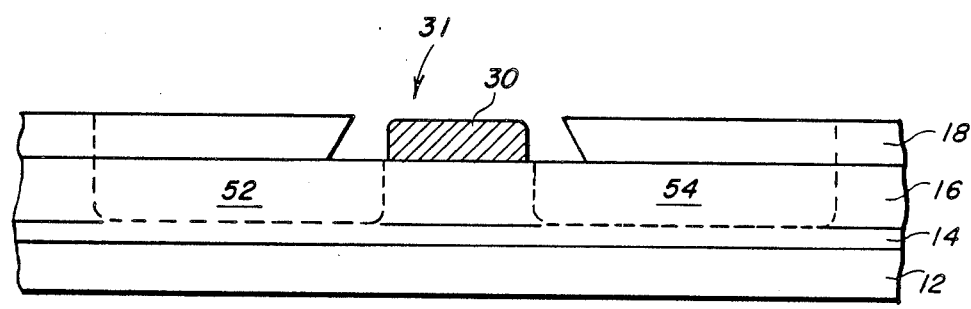
FIG. 6 shows the product resulting from etching off the unprotected metallization material from the product in FIG. 5, removing the polyimide from the product, and implanting source and drain regions in the product in FIG. 5.
Figure 7:
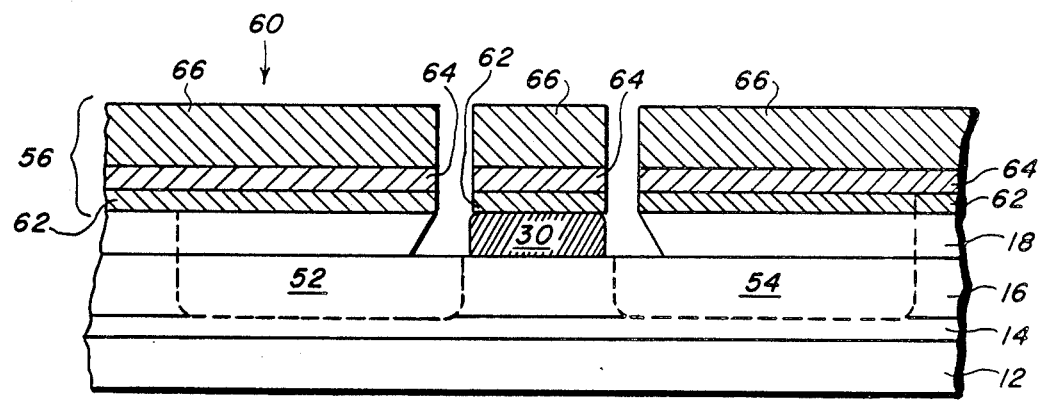
FIG. 7 shows the self-aligned gate FET resulting from metal contact deposition on the product in FIG. 6.

Then, a three-layer deposit 56 including Au, Ge, and Ni is built on the product of FIG. 6 to form the finished FET 60 depicted in FIG. 7. The three-layer deposition is brought about in an electron beam deposition system. More specifically, first a 500 angstrom layer 62 of Au-Ge is deposited on the top layers only of the product in FIG. 6. Preferably the Au-Ge layer is approximately 88% Au and 12% Ge. Next, a 500 angstrom layer 64 of Ni is deposited upon the Au-Ge layer 62. Then, a 1,000 angstrom overlayer 66 of Au is deposited on the Ni layer. By completion of the deposition of the Au, Ge, and Ni layers, the fabrication of the self-aligned FET transistor 60 is complete.

The length of the gate 30 can be controlled by appropriate selection or variation of the thickness of the layer 20 of GaAs. For example, if the layer 20 of GaAs were relatively thick, e.g. 5 microns, then upon etching with the orientation-dependent etchant, only a relatively short gate opening 31 would be formed; and a relatively short self-aligned gate 30 would be formed. On the other hand, if the layer 20 of GaAs were relatively thin, e.g. 1 micron, then upon etching with the orientation-dependent etchant, a relatively long gate opening 31 would be formed; and a relatively long self-aligned gate 30 would be formed.

It is noted that the relatively short gate and the relatively long gate are both in the submicron range. More specifically, a short gate 30 would be 10 angstroms long; and a long gate 30 would be 50 angstroms long.

Furthermore, the angularity of the angular recess may be varied by varying the thickness of the uppermost deposited layer and the thickness of the top layer of the heterostructure substrate. In addition, the angularity of the angular recess may be varied by varying the composition of the uppermost deposited layer and the composition of the top layer of the heterostructure substrate.

Numerous benefits are obtained by following the principles of the invention. With the invention, a method of making a GaAs field effect transistor is provided in which the gate is self-aligned to the source and to the drain. With the invention, a method of GaAs field effect transistor manufacture is provided by which the field effect transistors can have gate lengths of controlled length, even of submicron length. With the invention, a method of making GaAs field effect transistors is provided in which orientation-dependent etching is employed. In accordance with the invention, a doped GaAs/AlGaAs heterojunction device is provided that has self-aligned gates.

By this invention, a heavily n-doped layer connects the gate to drain and the gate to source thereby series resistance is decreased through the connection of the gate to drain and gate to source with a heavily n-doped layer.

It will be understood that various changes in the steps and details which have been herein described and illustrated to explain the nature of the invention, may be made by those skilled in the art within the principles and scope of the invention as expressed in the appended claims.

For example, the top 10 angstrom GaAs layer may be eliminated. Also, the composition of the etchants may be varied to obtain different angles etched in the GaAs layer.

What is claimed is:

1. A method of making a field effect transistor having a gate aligned with a source and drain, comprising the steps of:
    obtaining a selectively doped heterostructure substrate having a heavily doped top layer capable of being etched by an orientation-dependent etchant, having a heavily doped etchant-resistant layer under the top layer that is resistant to etching by the orientation-dependent etchant, and having an underlying layer, the layers having a predetermined crystalline orientation,
    depositing an uppermost layer on the top layer that is capable of being etched by the orientation-dependent etchant,
    etching an angular recess through the uppermost layer and through the top layer of the heterostructure substrate with an orientation-dependent etchant down to the etchant resistant layer, said recess having a top length and a base length, wherein the length of the angular recess is wider at the base of the recess than at the top of the recess because of the predetermined crystalline orientation and the orientation-dependent etchant,
    depositing a refractory metal in the recess to form the gate wherein the length of the refractory metal gate is substantially the same as the length of the top of the recess and depositing refractory metal on the top surface of the uppermost layer;
    covering the refractory metal gate with an etch-resistant and organic-solvent-soluble material;
    removing the refractory metal from the uppermost layer without removing the etch-resistant and organic-solvent-soluble material;
    implanting source and drain regions with implantable ions into the etchant-resistant layer which is not substantially etched by the orientation-dependent etchant;
    removing the uppermost layer and the etch-resistant and organic-solvent-soluble material, whereby the top surface of the refractory metal gate is uncovered; and
    depositing metal contacts on the refractory metal gate and over the source and drain regions to complete fabrication of the self-aligned field effect transistor structure.

2. The method described in claim 1 wherein the length of the gate is submicron in size.

3. The method described in claim 1 wherein the angularity of the angular recess may be varied by varying the thickness of the uppermost deposited layer and the thickness of the top layer of the heterostructure substrate.

4. The method described in claim 1 wherein the angularity of the angular recess may be varied by varying the composition of the uppermost deposited layer and the composition of the top layer of the heterostructure substrate.

5. The method described in claim 1 wherein the angularity of the angular recess may be varied by selection of the orientation-dependent etchant.

6. The method described in claim 1 wherein the refractory metal gate is made from refractory metals selected from the group consisting of tantalum silicide, tungsten silicide, and platinum silicide.

7. The method described in claim 1 wherein the refractory metal gate is deposited in a layer in the range of from 2,000 to 4,000 angstroms.

8. The method described in claim 1 wherein the uppermost deposited layer is deposited in a range of from 10 to 50 angstroms.

9. The method described in claim 1 wherein the orientation-dependent etchant is comprised of sulfuric acid:hydrogen peroxide:water in a ratio of approximately 1:8:1.

10. The method described in claim 1 wherein the orientation-dependent etchant is comprised of hydrochloric acid:hydrogen peroxide:water in a ratio of approximately 1:1:9.

11. A method of making a self-aligned field effect transistor, comprising the steps of:
   obtaining a selectively doped heterostructure substrate having a heavily doped top GaAs layer capable of being etched by an inorganic acid-hydrogen peroxide-water-based orientation-dependent etchant, having a heavily doped etchant-resistant AlGaAs layer under the top layer that is substantially resistant to etching by the orientation-dependent etchant, having an undoped underlying AlGaAs layer, and having an undoped bottom GaAs layer, the layers having a predetermined crystalline orientation;
   depositing an uppermost GaAs layer on the top layer that is capable of being etched by the orientation-dependent etchant,
   etching an angular recess through the uppermost GaAs layer and through the top heavily doped GaAs layer of the heterostructure substrate with an orientation-dependent etchant down to the heavily doped AlGaAs etching resistant layer, said recess having a top length and a base length, wherein the length of the angular recess is wider at the base of the recess than at the top of the recess because of the predetermined crystalline orientation and the orientation-dependent etchant;
   depositing a tantalum silicide in the recess to form a refractory metal gate wherein the length of the refractory metal gate is substantially the same as the length of the top of the recess and depositing refractory metal on the top surface of the uppermost layer;
   covering the refractory metal gate with an etch-resistant and organic-solvent-soluble polyimide material;
   removing the refractory metal tantalum silicide from the uppermost GaAs layer without removing the etch-resistant and organic-solvent-soluble polyimide material;
   implanting source and drain regions with implantable ions into the heavily doped, etchant-resistant AlGaAs layer which is not substantially etched by the orientation-dependent etchant;
   removing the uppermost GaAs layer and the etch-resistant and organic-solvent-soluble polyimide layer whereby the top surface of the refractory metal gate is uncovered; and
   depositing metal contacts on the refractory metal gate and over the source and drain regions to complete fabrication of the self-aligned field effect transistor structure.

12. In a method of making a self-aligned field effect transistor wherein a multi-layer heterojunction substrate having a predetermined crystalline structure is subjected to steps including deposition, etching, and ion implantation, the improvement comprising the steps of:
   depositing an uppermost layer on the top layer of the heterojunction substrate, said uppermost layer capable of being etched by an orientation-dependent etchant, wherein the heterojunction substrate also includes a layer resistant to an orientation-dependent etchant,
   etching an angular recess through the uppermost layer and through the top layer of the heterostructure substrate with an orientation-dependent etchant down to the layer resistant to etching, whereby the length of the angular recess is wider at the base of the recess than at the top of the recess because of the predetermined crystalline structure and the orientation-dependent etchant;
   depositing a refractory metal gate in the recess wherein the length of the refractory metal gate is substantially the same as the length of the top of the recess and depositing refractory metal on the top surface of the uppermost layer;
   covering the refractory metal gate with an etch-resistant and organic-solvent-soluble material;
   removing the refractory metal from the uppermost layer without removing the etch-resistant and organic-solvent-soluble material;
   implanting source and drain regions with implantable ions into the layer which is not substantially etched by the orientation-dependent etchant;
   removing the uppermost layer and the etch-resistant and organic-solvent-soluble layer; and
   depositing metal contacts on the refractory metal gate and over the source and the drain regions to complete fabrication of the self-aligned field effect transistor structure.

* * * * *